United States Patent

[11] 3,593,177

[72] Inventor Masayoshi Tanaka
Tokyo, Japan
[21] Appl. No. 792,444
[22] Filed Jan. 21, 1969
[45] Patented July 13, 1971
[73] Assignee Honeywell Inc
Minneapolis, Minn.
[32] Priority Jan. 19, 1868
[33] Japan
[31] 43-2922

[54] INPUT SWITCHING CIRCUIT

2 Claims, 3 Drawing Figs.

[52] U.S. Cl. 330/185, 330/51, 307/259, 330/69, 328/96, 307/242
[51] Int. Cl. H03f 1/00
[50] Field of Search 330/51, 64; 307/242, 243, 253, 259; 328/96, 97

[56] References Cited

UNITED STATES PATENTS

| | | | |
|---|---|---|---|
| 2,941,095 | 6/1960 | Miranda | 307/242 |
| 3,135,873 | 6/1964 | Werme | 307/243 X |
| 3,379,898 | 4/1968 | Adler et al. | 307/243 X |

*Primary Examiner*—Nathan Kaufman
*Attorneys*—Arthur H. Swanson and Lockwood D. Burton

ABSTRACT: A single signal current is selected from a plurality of signal currents of varied levels, is amplified and is supplied to means for effecting measurement operation or signal conversion of the amplified signal current.

INVENTOR
MASAYOSHI TANAKA
BY
Lockwood D. Burton
ATTORNEY

INPUT SWITCHING CIRCUIT

BACKGROUND OF THE INVENTION

The present invention relates to an input switching circuit.

In a conventional input switching circuit wherein out of a plurality of signal currents of varied levels such as 4—20 maDC or 10—50 maDC, one signal current is selected and amplified and then is supplied into means for effecting measurement operation or signal conversion of its output voltage, signal currents $I_1, I_2, \ldots I_n$ are flown to corresponding precision resistors $R_1, R_2, \ldots R_n$ to be thereby converted into the voltage signals $I_1R_1, I_2R_2, \ldots I_nR_n$ which are then transferred through the mechanical changeover switches (normally opened) such as lead switches, $S_1, S_2, \ldots S_n$ to a measuring amplifier $A_1$ consisting of a high input impedance DC amplifier to be impressed thereat, and then a specific changeover switch means is closed by a separately provided switch actuator (not shown) so that the signal voltage of the corresponding channel is impressed to the amplifier $A_1$ in which the signal voltage is amplified, whereby the signal current of the channel to be selected is brought out as an output voltage $e_o$. In case this amplifier circuit composes an analogue-digital converter (or in case the amplifier output $e_o$ is given to an A/D converter), the signal current is converted into a digital signal. Thus, in this manner, a signal current of the channel selected from a plurality of channels is converted into a digital signal.

However, such conventional input switching circuit requires as many precision resistors as the number of the channels and is therefore very uneconomical.

SUMMARY OF THE INVENTION

The input switching circuit according to the present invention comprises channels each including a signal current source and a diode connected in the forward direction of the current and between an end of the input terminal and a common line, a high-gain measuring amplifier having its other input terminal connected to the common line, and switches each inserted and connected between one input terminal of the amplifier and the output terminal of the signal current source of each channel.

When a predetermined switch is closed, the signal current of the predetermined channel does not flow into the diode and flow the switch and the amplifier to obtain an output voltage.

It is therefore an object of the present invention to provide a novel input switching circuit wherein the signal current is directly given to the measuring amplifier, without being converted into a voltage signal.

It is another object of the present invention to provide an inexpensive input switching circuit wherein the precision resistors are not provided in each channel.

DESCRIPTION OF THE PREFERRED EMBODIMENT

Figure 1:
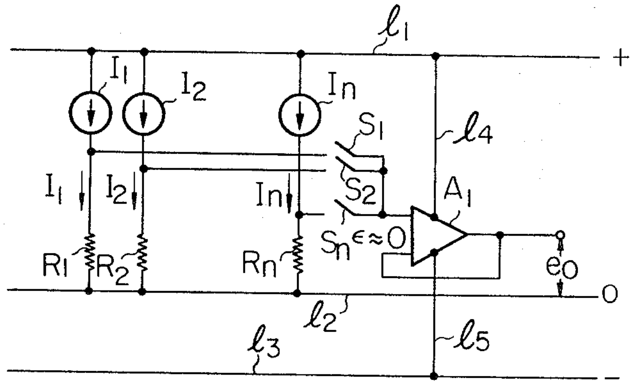
FIG. 1 is a block diagram showing an embodiment of conventional input switching circuits.
Figure 2:
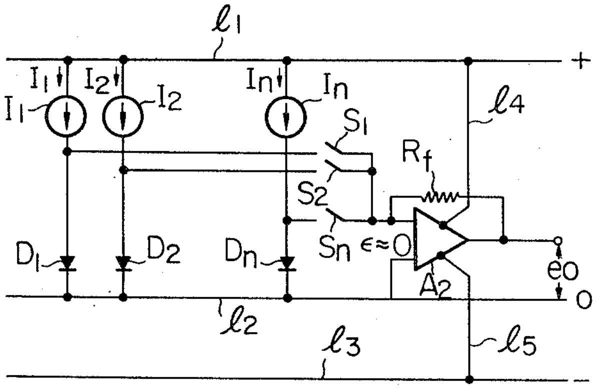
FIG. 2 is a block diagram showing an embodiment of the input switching circuit according to the present invention.

The circuit according to this invention will now be described in detail with reference to FIG. 2. Referring to FIG. 2, $I_1, I_2, \ldots I_n$ denote a plurality ($n$ pieces) of signal current sources, $D_1, D_2, \ldots D_n$ $n$ pieces of diodes as nonlinear elements in the forward direction with respect to the signal currents from the corresponding signal current sources and connected between a common line $l_2$ and the corresponding signal current sources, $A_2$ a measuring amplifier having a feedback resistor $R_f$ connected between an input terminal and an output terminal, $S_1, S_2, \ldots S_n$ $n$ pieces of changeover switches such as lead switches each having its one contact connected to the input terminal of the measuring amplifier $A_2$ and having its other contact connected to a junction point between the signal current source of each channel and a diode, $l_1$ and $l_3$ respectively DC feed lines, and $l_4$ and $l_5$ respectively current feed lines for the measuring amplifier. The other input terminal of the measuring amplifier is earthed to the common line $l_2$. The changeover switch actuating means are provided separately.

In the following will be described the operation of the embodied circuit of the present invention having the above-described construction. Since the changeover switches $S_1, S_2, \ldots S_n$ are normally opened, no selection of channel is made in the state of FIG. 2, and the signal current of each channel flows in the forward direction in the corresponding diode and is not flown into the measuring amplifier. (In this case, the output voltage $e_o$ of the amplifier is zero.) When the changeover switch actuating means are operated to close the changeover switch $S_k$ of a predetermined channel K to be selected, the signal current $I_k$ of the channel K is not flown to the diode $D_k$, and is flown through the switch $S_k$, one input terminal of the measuring amplifier $A_2$ and the feedback resistor $R_f$ of the measuring amplifier $A_2$ to the output terminal thereof, whereby an output voltage of a magnitude of $I_k R_f$ is obtained. In this manner, the signal current $I_k$ of the channel K is selected.

The reason why the signal current is not flown in the forwardly connected diode when the changeover switch is closed will be known from the fact that the measuring amplifier $A_2$ is an amplifier of high gain, of which one input terminal is substantially equal to the potential of the common line $l_2$, while the diode $D_k$ is a nonlinear element and it requires a certain amount of voltage (about 0.6 v. in case of a silicon diode) to conduct the current through this diode. For more particulars about this point, reference is made to Japanese Pat. No. 459,742 (Publication No. 11,971/1965) which is the basis for technical conceptions of the present invention.

Figure 3:
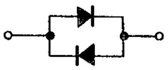
FIG. 3 is a view showing a diode circuit used in another of the present invention.

In case the input in the changeover switch circuitry is bidirectional, the diodes may be substituted by a diode circuit such as shown in FIG. 3. Such requirement is made for example in sampling of deviation. It may also be practiced if need be to impress a bias voltage to the input terminal at the common line side of the measuring amplifier.

I claim:

1. A current signal switching circuit comprising, in combination, an amplifier having an input circuit;

an output circuit, and a feedback circuit interconnecting said output circuit and said input circuit;

a plurality of input signal current means;

selectively controlable gate means connected between each of said input signal means and said input circuit of said amplifier, said selectively controlable gate means comprising the sole impedance means between said plurality of input current means, respectively, and said input circuit of said amplifier; and voltage responsive gating means connected between each of said input signal current means and a point of fixed reference potential, said voltage responsive gating means comprising the sole impedance means between said input signal current means, respectively, and said point of fixed reference potential, said voltage responsive gating means being operative in response to the actuation of corresponding ones of said selectively controlable gate means.

2. The invention as set forth in claim 1 wherein said voltage responsive gating means comprise diodes which are effective to block the passage of signals to said point of fixed reference potential whenever the associated one of said controllable gate means is actuated to unblock the passage of said signals to said input circuit of said amplifier.